United States Patent [19]

Wood

[11] 4,047,498

[45] Sept. 13, 1977

[54] APPARATUS AND METHOD FOR REPEATABLE TRANSFERS OF LIQUID DEPOSITS

[76] Inventor: Laurier A. Wood, 2 Vose Road, Westford, Mass. 01881

[21] Appl. No.: 634,048

[22] Filed: Nov. 21, 1975

[51] Int. Cl.² ............................................. B05C 1/02
[52] U.S. Cl. .................................. 118/243; 118/263
[58] Field of Search ............... 118/243, 263, 211, 238

[56] References Cited
U.S. PATENT DOCUMENTS

| | | | |
|---|---|---|---|
| 2,510,274 | 6/1950 | Barry et al. | 118/243 |
| 3,025,830 | 3/1962 | Vierthaler et al. | 118/243 |
| 3,706,274 | 12/1972 | Coville | 118/263 |

*Primary Examiner*—Dorsey Newton
*Attorney, Agent, or Firm*—Pearson & Pearson

[57] ABSTRACT

A liquid pick-up, transfer and deposit system achieves controlled thickness, reproducible deposits of viscous liquid, such as epoxy, on a substrate, for subsequent attachment of microscopic size dies, by maintaining a layer of uniform, thickness of the viscous coating in a receptacle and moving an applicator stamp, back and forth between the receptacle and a substrate constituting the workpiece. The deposit area and thickness of coating on the tip of the applicator is kept uniform by a gravity actuated plunger yieldable rearwardly opposed only by its own weight. The plunger tip accommodates itself to the surface it contacts.

10 Claims, 10 Drawing Figures

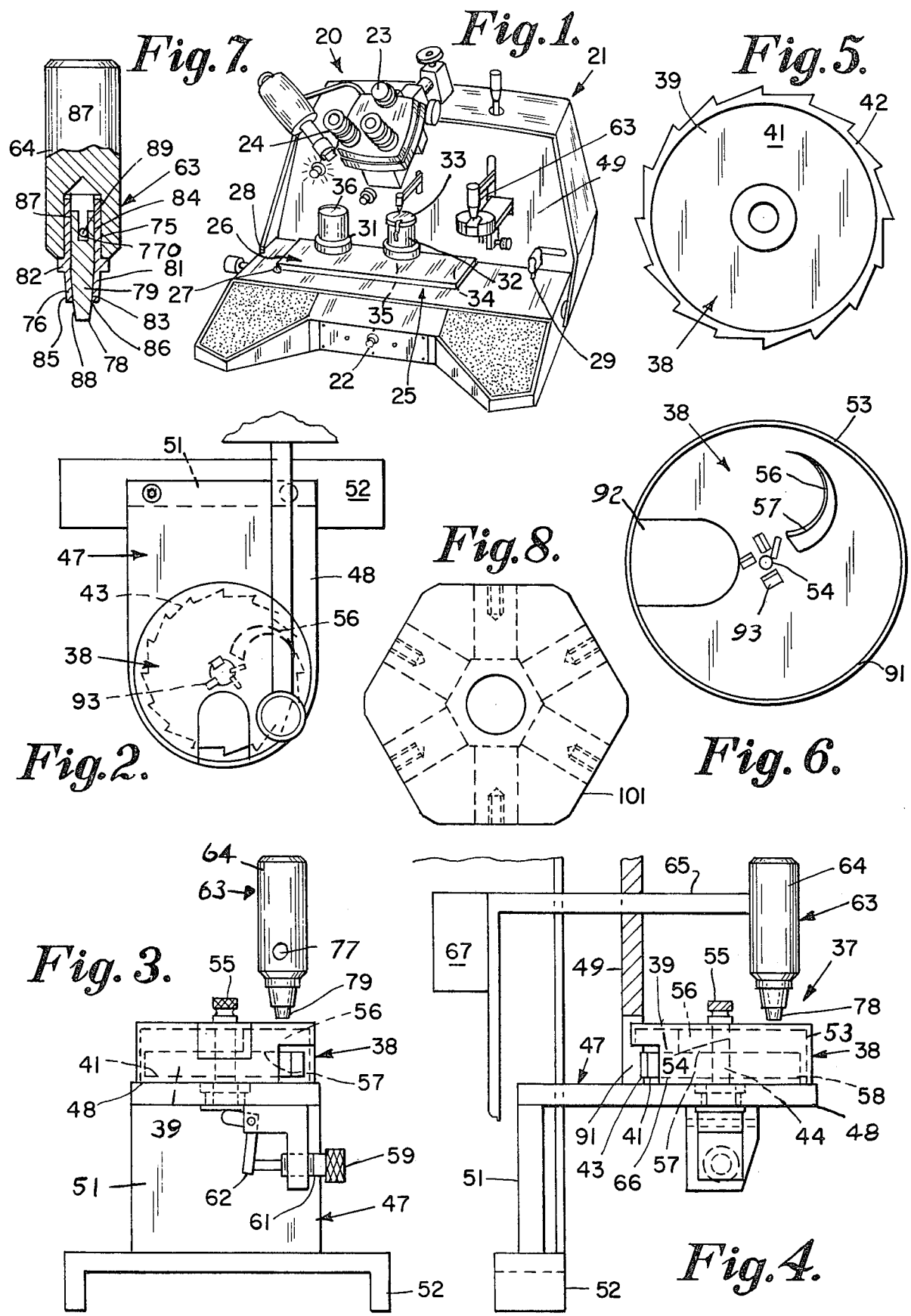

APPARATUS AND METHOD FOR REPEATABLE TRANSFERS OF LIQUID DEPOSITS

BACKGROUND OF THE INVENTION

In the electronic art one of the problems has been the affixing of microscopic size dies by a layer of adhesive onto a substrate such as a printed circuit board. To date, while a costly machine, equipped with magnifying lenses and movable racks for conveying successive substrate workpieces into magnified position, are well known, it has still been necessary for an operator to manually apply a microscopic deposit of the bonding agent precisely on the substrate ready to receive each die. When the coating, usually of a highly viscous epoxy, has been deposited. The die is then manually or automatically deposited on the coating and the printed circuit then is moved to a heated environment for setting of the epoxy.

In various arts, it has been proposed to provide a liquid transfer apparatus having a source of liquid coating, a coating applicator including a plunger movable within a housing and an arm supporting the applicator for movement between the source of liquid coating and a workpiece.

For example, in U.S. Pat. No. 3,034,478 to Schwartz of May 15, 1962, a deposit of liquid alloy in pellet form is picked up in the open end of an axial bore in a cylindrical housing and then ejected by the tip of a plunger, movable in the housing for deposit onto a workpiece.

In U.S. Pat. No. 3,198,169 to Pike of Aug. 3, 1965, a plurality of plungers are moved upwardly through a bath of liquid, to cause each plunger tip to deposit a coating on the under face of a workpiece such as a clock dial.

In U.S. Pat. Nos. 3,332,394 to Cooke of July 25, 1967, 3,706,274 to Coville of Dec. 19, 1972 and Re. 22,118 to Lohrey of June 16, 1942, pivoted, or oscillating, arms are shown which carry applicators, having no movable plungers, from tip contact with a source of liquid to tip contact with a workpiece.

However in none of the above patents is the pressure of application so controlled as to assure a pick up of a precise thickness of liquid film, a precise deposit of a controlled thickness on a substrate and a uniform thickness of liquid even if the liquid supply surface is uneven or the substrate surface is uneven.

SUMMARY OF THE INVENTION

In this invention the liquid supply means, or source, is a receptacle having a bottom of predetermined contour and a blade with an identical contour moving in parallelism thereover so as to maintain a thin layer, or film, of controlled thickness. An applicator having a housing with a tapered bore in which a tapered plunger is axially movable is supported on an arm for movement between the receptacle and a substrate. The plunger tip thus is applied to the liquid layer in the receptacle under the pressure of gravity, due to the weight of the plunger, to pick up a controlled thickness, and area, on the tip, while conforming to any unevenness in the layer by tilting slightly. The plunger tip is then applied to the substrate under identical, reproducible conditions, in that the application pressure is only that of gravity exerted on the plunger and slight tilting and yielding is possible if the surface of the substrate is uneven.

The epoxy die bonder of the invention is thus a production work station for accurately and precisely mounting single or multiple dice on a diversity of substrates and packages, each time depositing repeatable amounts of epoxy, or other liquid viscous material. Identical pressure is exerted with each deposit thereby avoiding the irregular depositions of epoxy which have plagued the art in the past. Variations in the height of the substrate do not cause irregular pressure because the gravity actuated, yieldable, plunger compensates for such irregularities.

BRIEF DESCRIPTION OF THE DRAWING

FIG. 1 is a front perspective view of a liquid transfer apparatus in which the epoxy stamping apparatus of the invention has been installed;

FIG. 2 is a top plan view, on an enlarged scale of the liquid supply means of the invention;

FIG. 3 is a front elevation thereof;

FIG. 4 is a side elevation thereof;

FIG. 5 is a top plan view of the liquid receptacle shown in FIGS. 2, 3 and 4;

FIG. 6 is a bottom view of the receptacle cover, stationary curved levelling blade and spring vanes which cooperate with the receptacle;

FIG. 7 is a front elevation, in half section of an individual applicator head, housing and plunger of the invention;

FIG. 8 is a front elevation of a multiple applicator head, containing a plurality of applicators each of different weight and area of contact;

DESCRIPTION OF A PREFERRED EMBODIMENT

Figure 9:
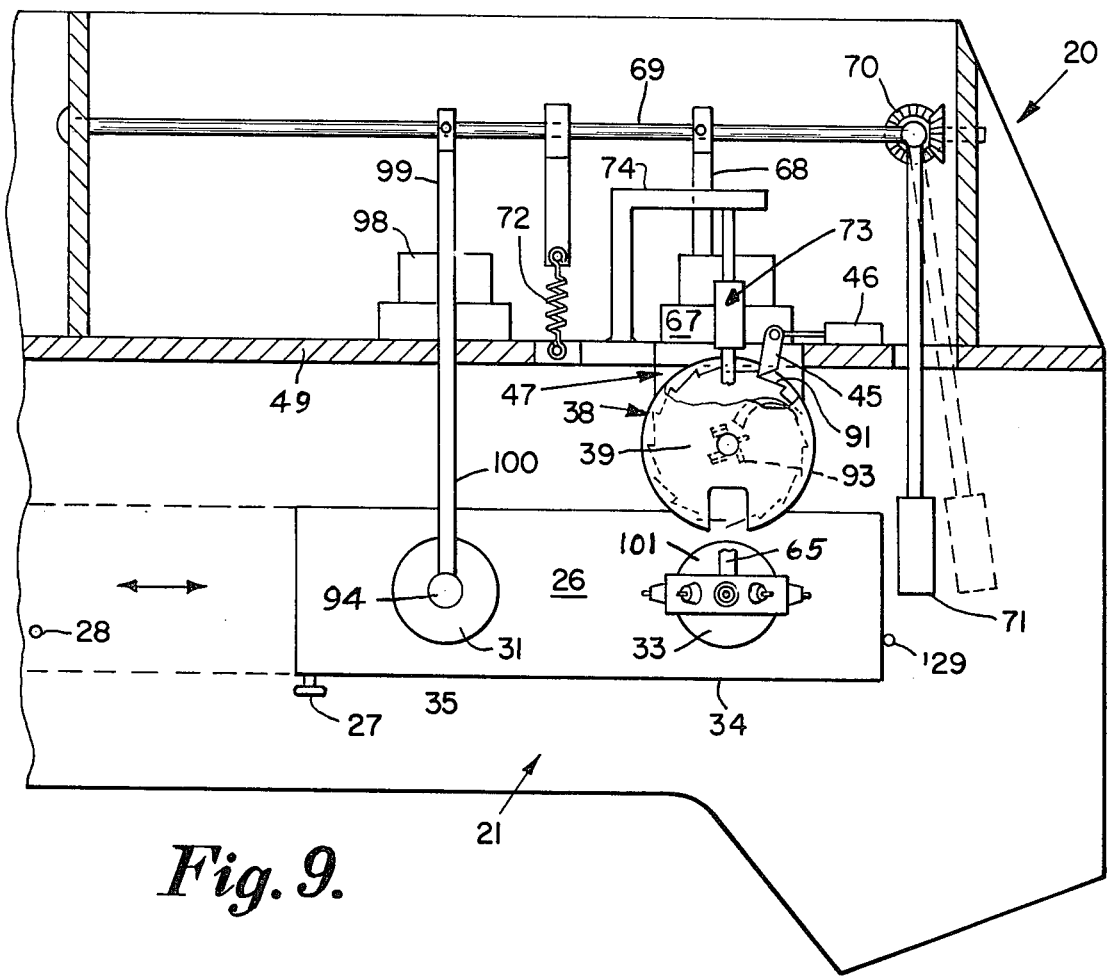
FIG. 9 is a diagrammatic plan view of the mechanism for moving the heads.
Figure 10:
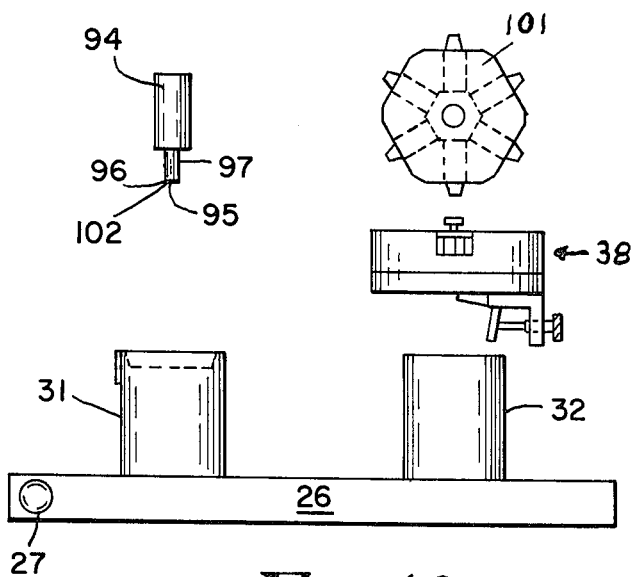
FIG. 10 is a front elevation of the die head and stamp head.

A liquid transfer apparatus, or epoxy die bonder, 20 is shown in FIG. 1, there being a console 21, having controls 22, a stereo, zoom microscope 23, light source 24, platform 25, horizontally translatable carriage 26 and handle 27 for sliding the carriage. In this type device, there is a limit switch 28 and 29 each at an opposite end of the carriage track for controlling the actuation of the other parts of the apparatus. A pair of work holders, or bases, 31 and 32 are precisely located on carriage 26 so that when a substrate 33, on one holder 32, is at the stamping station 34, the other holder 31 is precisely located at the the die receiving station 35 for receiving a die 36 such as a transistor, resistor, capacitor chip, or the like, and "vice versa.

It will be understood that the operator places a relatively small workpiece, or substrate 33, such as a printed circuit, on a work holder such as 31 and aligns it by the use of the microscope 23 ready for the deposit of a dot of bonding adhesive such as epoxy. The bonding material is not yet set or cured and is in thixatropic condition and highly viscous. As stated above, the precise and accurate deposit of a controlled thickness and area of such bonding material in the prior art has been virtually impossible because accomplished manually by the operator with all the vagaries of dipping, over pressure, under pressure and undue spreading of the epoxy.

The liquid transfer apparatus 37 of this invention includes an improved source of coating, or liquid supply means, 38 having a dished, liquid receptacle 39, preferably with a flat, horizontal, planar bottom 41 and cylindrical, upstanding, side wall 42 (FIG. 5). The exterior periphery of wall 42 is provided with integral ratchet teeth 43 and the receptacle 39 is mounted for rotation in a horizontal plane on a vertical axis 44. Thus a pivoted pawl 45, actuated by air cylinder and piston 46, with each cycle of carriage 26, causes the cup-shaped receptacle 39 to rotate the angular distance of one tooth with each translation cycle of the carriage. The receptacle 39 is supported for rotation on support means 47 which includes the horizontal table 48 which projects from a slot in the upstanding panel 49 of apparatus 20, the table 48 having a vertical leg 51 with an inverted U-shaped base 52, located behind the panel.

Liquid supply means 38 also includes a cylindrical cover 53, affixed on the table 48 by the threaded shaft 54 which constitutes the vertical axis of rotation 44, and by a threaded cap screw 55, there being a curved, integral levelling, smoothing or doctor blade 56 depending downwardly within the cover 53. The levelling edge 57 of blade 56 is in parallelism with the plane of the bottom 41 of receptacle 39, the bottom 41 preferably being flat and horizontal so that liquid film 58 resting thereon will be of uniform thickness and smoothed into a flat plane, after each contact of a plunger tip 78, by the blade edge 57 as the receptacle rotates.

It will be understood that while liquid 58 of any type, or viscosity, can be used in the invention, the apparatus is especially intended for handling of material such as epoxy in substantially thixatropic condition and of a viscosity ranging from about 25,000 centipoise to 250,000 centipoise and preferably about 100,000 centipoise. The surface of such material may be uneven and wavy and may not level itself because of its tackiness, its consistency being similar to that of sour cream at ambient temperatures. If an object is dipped into the material, the material will stick to the object but will not drip off. If a stress or shear force is applied, the material will flow but will cease flow upon removal of the force.

The controlled thickness of the layer, or film, of such material 58 on the flat planar bottom 41 of receptacle 39 is obtained by turning the vernier knob 59, which advances thrust screw 61, in turn pivoting L-shaped lever 62 and in turn raising receptacle 39 within cover 53 to move the bottom 41 toward, or away from, edge 57 of blade 56. Other levelling means could be used, but the integral blade 56 and rotatable, liftable receptacle 39 is preferred.

The applicator, or stamp 63, as shown in FIG. 7, includes a head 64 mounted on the end of an arm 65, the arm 65 being movable back and forth in a predetermined path between the receptacle 39 and the substrate 33 at the stamping station 34 and arranged to move downwardly at each opposite end of the path to pick up a film from the uniform thickness layer, 66 on the bottom 41 of receptacle 39, at one end, and deposit that film on the substrate 33 at the other end of the path. The arm 65 is supported on a vertical ball slide 67, lowerable by crank arm 68 on a shaft 69 turned by gears 70, when handle 71 is moved against the bias of coil spring 72 to follow the precise accurate path desired. The stamp head 64 and arm 65 are moved back and forth by air cylinder and piston means 73 supported on bracket 74.

The applicator head 64 includes a cylindrical axial bore 75 in which any one of a plurality of different sized stamp members 76 may be affixed by a set screw 77, depending on the area of tip 78 desired for the deposit and the weight of the free floating plunger 79 carrying the tip 78, the weight depending on the viscosity of the liquid being transferred.

Each stamp member 76 includes a housing 81, having an exterior annular flange, or shoulder, 82 and an axial bore 83 which has an inner cylindrical portion 84 and an outer tapered, or truncated, conical portion 85 terminating in an open end 86 of reduced diameter. The free floating plunger 79, which is movable axially within, and captive in, housing 81, includes an enlarged, rearward, cylindrical portion 87 which preferably is slightly smaller in diameter than the diameter of the cylindrical portion 84 of the housing 81 for a free sliding fit with minimum friction. Plunger 79 also includes a forward, integral, tapered, or truncated conical, portion 88 which rests in the tapered portion 85 but projects substantially from open end 86 to terminate in tip 78.

As stated above the plunger 79 of each stamp member is of predetermined weight and the tip 78 is of predetermined, flat, planar, area, to conform with the viscosity of the epoxy, or other liquid, desired to be transferred. Upon application to the controlled thickness, thin film layer 66, the tip 78 will not penetrate through the layer to press the material sidewise and therefore not pick up the desired uniform thickness deposit. Instead, it will contact the film 78 only with the pressure of its own predetermined weight, under the force of gravity, and will yield rearwardly as a free floating plunger, despite any additional downward movement of the head or arm. A controlled thickness deposit 66 of the thixatropic liquid 58 is thus picked up, transferred and deposited on the substrate, again with a free floating, gravity pressure of the plunger on the substrate so that the film is not unduly spread out, squeezed or otherwise thinned or thickened.

The portion 87 of plunger 79 is slotted at 770 to receive a transverse pin 89 to prevent rotation while permitting axial movement. The fit of plunger 78 in the housing is sufficiently loose to enable the tip 78 and plunger 79 to tilt slightly to conform to any unevenness in the layer 66 or in the substrate 33.

A layer of felt, or the like, may be adhered to tip 78 when advantageous for certain, relatively free flowing liquids.

Cover 53 is provided with a cut out 91 for access of the pawl 45 to the teeth 43 and a cut out 92 for access of the stamp member 76 to the film 66 on the receptacle bottom 41. Integral spring leaf vanes 93 extend downwardly from the central portion of cover 53 to urge the liquid outwardly away from the central area of the bottom into contact with the blade edge 57, while resiliently urging the receptacle 39 downwardly.

The apparatus 20 also includes a die head 94, having a vacuum opening 95 in the tip 96 of its free floating plunger 97, corresponding to plunger 79, and carried by an arm 100, supported on a ball slide 98 corresponding to ball slide 67. A crank arm 99 on shaft 69 actuates die head 94 at die receiving station 35 in unison with stamping head 64 at stamping station 34. Thus the heads 94 and 64 rise and fall together in parallelism and in respective vertical paths, each time handle 71 is actuated but head 64 also is translated back and forth between the receptacle 39 and the substrate 33.

Preferably a multiple head 101 (FIG. 8) is provided serving as a rotatable turret, lockable by a set screw at any of six angular positions on arm 65 and having eight spaced bores such as 83 each for a stamp 76 of a different size.

In operation a chip, or die, 102 is vacuum attached to the tip 96 of die head 94, a film 66 of controlled thickness of epoxy is formed on flat bottom 41, and a substrate 33 is carefully aligned on work holder 31 ready to receive a deposit of epoxy. The slide, or carriage 26, is moved to the right by handle 27, to position the holder 31 at the die station 35 and the work holder 32 at the stamping station 34. The handle 71 is then pushed to the right, which causes the stamp tip to be stamped on the substrate at the proper location and at the same time turn on the vacuum for the die pick up. The handle 71 is then returned to its normal position. The carriage is then moved to the left to its stop which places the work holder 32 under the die. The handle 71 is then again moved to the right which causes the die to be lowered onto the film deposit of epoxy on the substrate 33 and the vacuum holding the chip in open end 96 is released to deposit it on the epoxy. The cycle is then repeated, the air piston means 73 translating the head 101 back to the flat bottom 41 for another deposit and the pawl 45 rotating the receptacle 39, one tooth length, in synchronization with the carriage movement.

I claim:

1. Liquid transfer apparatus of the type having a source of coating, an applicator including a plunger movable within a housing and an arm supporting said applicator for movement between said source of coating and a work piece said apparatus characterized by said source of coating including means for maintaining a layer of controlled, uniform, thickness of viscous coating, and said plunger having a tip projecting beyond said housing adapted to pick up a layer of controlled thickness from said source and stamp said layer on said work piece, and having an enlarged rearward portion captive within, but axially slidable relative to said housing for stamping only with the force of gravity determined by the weight of said plunger.

2. Apparatus as specified in claim 1 wherein:

said housing includes an axial bore having an inner cylindrical portion and an outer tapered portion terminating in an open end of reduced diameter and said plunger includes an inner cylindrical portion and an outer tapered portion terminating in said tip, said inner portions and said tapered portions being of predetermined diameters for free floating and sliding of said plunger rearwardly into said bore.

3. Apparatus as specified in claim 1 wherein:

said rearward portion of said plunger is cylindrical and loosely slidably fits a cylindrical bore in said housing, said housing includes a pin extending transversely across said cylindrical bore and said rearward cylindrical portion includes a slot receiving said pin for preventing rotation or escape thereof, while permitting free floating.

4. Apparatus as specified in claim 1 plus:

a dished receptacle constituting said source of coating, said receptacle having a flat planar bottom, means supporting said receptacle for rotation in a horizontal plane on a vertical axis and levelling means mounted above the level of the coating in said receptacle and extending thereover for establishing a predetermined thickness of coating on said planar bottom as said receptacle rotates thereby.

5. Apparatus as specified in claim 1 plus:

receptacle means constituting said source of coating, said means having a flat planar bottom, levelling means adapted to level the coating on said bottom to a layer of predetermined thickness and mechanism for moving one said means relative to the other to maintain a layer of controlled thickness on said bottom for pick up by the tip of said plunger.

6. Apparatus as specified in claim 1 wherein:

said source of coating is a dished receptacle, having a flat planar bottom, mounted for rotation in a horizontal plane, a smoothing blade mounted above said planar bottom to level coating therein to a predetermined thickness and fluid power actuated ratchet and pawl mechanism for rotating said receptacle relative to said blade.

7. Apparatus as specified in claim 1 wherein:

said coating is thixatropic and of predetermined viscosity in the range of from about 25,000 centipoise to 250,000 and preferably about 100,000 centipoise;

and said plunger has a tip face of predetermined area, and a tip and rearward portion of predetermined dimensions and weight whereby said plunger tip deposits a controlled thickness of coating.

8. Apparatus as specified in claim 1 wherein:

said tip includes a flat planar face at the terminal end of predetermined area substantially equal to the area of the work piece receiving a deposit therefrom.

9. Apparatus as specified in claim 1 wherein:

said tip includes a flat planar face on the terminal end thereof and a layer of felt of uniform thickness adhered thereto said felt enabling transfer of relatively fluid coatings.

10. Transfer apparatus for making reproducible epoxy depositions on substrates said apparatus comprising:

a stamp having a housing with a stamp plunger axially slidable therein, said plunger being of predetermined weight, free floating and having a tip projecting beyond said housing with a tip face of predetermined area;

epoxy supply means including an open-top, epoxy-containing receptacle having a flat horizontal bottom, a doctor blade in smoothing contact with the epoxy on said flat bottom, and means for moving said receptacle and blade in relation to each other to maintain a flat smooth layer of epoxy of uniform thickness, and translation means for moving said stamp back and forth in a predetermined horizontal path between said receptacle and substrate and mechanism for raising and lowering said stamp in a vertical path at each opposite end of said path to pick up a predetermined area and thickness of said epoxy on said tip face and deposit the same on said substrate, independent of pressure other than the weight of said stamp whereby said free floating plunger automatically compensates for variations in height, or configuration, of said substrate.

* * * * *